(12) United States Patent
Qiu

(10) Patent No.: US 9,096,712 B2
(45) Date of Patent: Aug. 4, 2015

(54) CURABLE COMPOSITIONS, METHOD OF COATING A PHOTOTOOL, AND COATED PHOTOTOOL

(75) Inventor: Zai-Ming Qiu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 865 days.

(21) Appl. No.: 13/321,621

(22) PCT Filed: Jun. 29, 2010

(86) PCT No.: PCT/US2010/040349
§ 371 (c)(1),
(2), (4) Date: Nov. 21, 2011

(87) PCT Pub. No.: WO2011/011167
PCT Pub. Date: Jan. 27, 2011

(65) Prior Publication Data
US 2012/0107732 A1    May 3, 2012

Related U.S. Application Data

(60) Provisional application No. 61/227,228, filed on Jul. 21, 2009.

(51) Int. Cl.
*C08G 65/22* (2006.01)
*C09D 183/06* (2006.01)
*C09D 183/08* (2006.01)
*G03F 1/48* (2012.01)
*G03F 7/004* (2006.01)
*G03F 7/038* (2006.01)
*G03F 7/075* (2006.01)
*H05K 3/00* (2006.01)
*C08G 77/14* (2006.01)
*C08G 77/24* (2006.01)
*C08G 77/26* (2006.01)
*C08G 77/28* (2006.01)
*G03F 7/20* (2006.01)
*H05K 3/02* (2006.01)

(52) U.S. Cl.
CPC .............. *C08G 65/22* (2013.01); *C09D 183/06* (2013.01); *C09D 183/08* (2013.01); *G03F 1/48* (2013.01); *G03F 7/0046* (2013.01); *G03F 7/038* (2013.01); *G03F 7/0755* (2013.01); *H05K 3/00* (2013.01); *C08G 77/14* (2013.01); *C08G 77/24* (2013.01); *C08G 77/26* (2013.01); *C08G 77/28* (2013.01); *G03F 7/2014* (2013.01); *H05K 3/02* (2013.01); *H05K 2203/0557* (2013.01)

(58) Field of Classification Search
CPC ........ C08G 65/22; C08G 77/14; C08G 77/24; C08G 77/26; C08G 77/28; C09D 183/06; C09D 183/08; G03F 7/0046; G03F 7/0075; G03F 7/038; G03F 7/2014; G03F 1/48; H05K 3/00; H05K 3/02; H05K 2203/0557
See application file for complete search history.

(56) References Cited

U.S. PATENT DOCUMENTS

| | | |
|---|---|---|
| 3,131,161 A | 4/1964 | Nitzsche |
| 3,250,808 A | 5/1966 | Moore, Jr. |
| 3,753,755 A | 8/1973 | Olson |
| 3,875,045 A | 4/1975 | Bergrahm et al. |
| 4,000,115 A | 12/1976 | Jacobs |
| 4,025,348 A | 5/1977 | Tsukada |
| 4,025,407 A | 5/1977 | Chang |
| 4,049,861 A | 9/1977 | Nozari et al. |
| 4,058,401 A | 11/1977 | Crivello |
| 4,069,055 A | 1/1978 | Crivello |
| 4,094,911 A | 6/1978 | Mitsch |
| 4,100,134 A | 7/1978 | Robins et al. |
| 4,101,513 A | 7/1978 | Fox et al. |
| 4,130,690 A | 12/1978 | Lien et al. |
| 4,156,035 A | 5/1979 | Tsao |
| 4,156,046 A | 5/1979 | Lien et al. |
| 4,161,478 A | 7/1979 | Crivello |
| 4,267,302 A | 5/1981 | Ohmori |
| 4,279,717 A | 7/1981 | Eckberg et al. |

(Continued)

FOREIGN PATENT DOCUMENTS

| | | |
|---|---|---|
| DE | 100 04 132 | 8/2001 |
| EP | 0 212 319 | 3/1987 |

(Continued)

OTHER PUBLICATIONS

Supplementary European Search Report, PCT/US2010/040349, mailed Nov. 26, 2012, 7 pages.
Bongiovanni, "Use of Fluorinated Compounds in Cationic UV-curing," Photochemistry and UV Curing: New Trends, 2006, pp. 279-292.
Bongiovanni, "Fluorinated Additives in Cationic Photopolymerization," RadTech Europe, [online], [retrieved from the internet on Oct. 6, 2011], website no longer available, www.radtech-europe.com/filescontent/september%202004%20papers/bongiovannipaperseptember2004.pdf, 7 pages.

(Continued)

*Primary Examiner* — Sanza McClendon
(74) *Attorney, Agent, or Firm* — Bradford B. Wright

(57) ABSTRACT

A curable composition comprises: an epoxy silane represented by formula $X\text{—}Si(OR^1)(OR^2)(OR^3)$ wherein $R^1\text{-}R^3$ represent $C_1$ to $C_4$ alkyl groups, and X represents an organic group having at least one oxirane ring; a fluorinated silane represented by formula; wherein: $R_f$ represents a perfluoroalkyl group having from 3 to 5 carbon atoms, $R^4$ represents H or a $C_1$ to $C_4$ alkyl group, and $R^5\text{-}R^7$ represent $C_1$ to $C_4$ alkyl groups; and a photoacid. Use of the curable composition to coat a phototool, thereby providing a protective coating on the phototool is also disclosed.

21 Claims, No Drawings

(56) References Cited

U.S. PATENT DOCUMENTS

| | | | |
|---|---|---|---|
| 4,293,606 A | 10/1981 | Zollinger et al. | |
| 4,333,998 A | 6/1982 | Leszyk | |
| 4,337,107 A | 6/1982 | Eshleman | |
| 4,348,462 A | 9/1982 | Chung | |
| 4,353,980 A | 10/1982 | Helling | |
| 4,399,192 A | 8/1983 | Russell | |
| 4,426,431 A | 1/1984 | Harasta | |
| 4,504,401 A | 3/1985 | Matsuo | |
| 4,508,916 A | 4/1985 | Newell | |
| 4,623,676 A | 11/1986 | Kistner | |
| 4,647,413 A | 3/1987 | Savu | |
| 4,818,801 A | 4/1989 | Rice | |
| 4,830,910 A | 5/1989 | Larson | |
| 4,959,426 A | 9/1990 | Re | |
| 5,021,501 A | 6/1991 | Ohmori et al. | |
| 5,073,404 A | 12/1991 | Huang et al. | |
| 5,274,159 A | 12/1993 | Pellerite et al. | |
| 5,340,898 A | 8/1994 | Cavezzan | |
| 5,514,728 A | 5/1996 | Lamanna | |
| 5,554,664 A | 9/1996 | Lamanna | |
| 5,576,095 A | 11/1996 | Ueda | |
| 5,723,860 A | 3/1998 | Hamada | |
| 5,980,992 A | 11/1999 | Kistner et al. | |
| 6,187,834 B1 | 2/2001 | Thayer et al. | |
| 6,190,743 B1 | 2/2001 | Wang | |
| 6,204,350 B1 | 3/2001 | Liu | |
| 6,344,526 B1 | 2/2002 | Noguchi et al. | |
| 6,361,870 B1 | 3/2002 | Steffl et al. | |
| 6,448,346 B1 | 9/2002 | Noguchi et al. | |
| 6,646,088 B2 | 11/2003 | Fan | |
| 6,672,172 B2 * | 1/2004 | Tulkki et al. | 73/861.05 |
| 6,678,495 B1 | 1/2004 | Badesha | |
| 6,753,380 B2 | 6/2004 | Qiu | |
| 6,762,172 B1 * | 7/2004 | Elfersy et al. | 514/63 |
| 6,767,946 B2 | 7/2004 | Shimada | |
| 6,803,109 B2 | 10/2004 | Qiu | |
| 6,811,931 B1 | 11/2004 | Fujioka | |
| 7,037,585 B2 | 5/2006 | Treadway | |
| 7,097,910 B2 | 8/2006 | Moore | |
| 7,166,329 B2 | 1/2007 | Dams | |
| 7,189,479 B2 | 3/2007 | Lu et al. | |
| 7,196,132 B2 * | 3/2007 | Ukuda | 524/497 |
| 7,329,479 B2 * | 2/2008 | Itoh et al. | 430/312 |
| 7,335,786 B1 | 2/2008 | Iyer et al. | |
| 7,495,118 B2 | 2/2009 | Dams et al. | |
| 7,718,264 B2 | 5/2010 | Klun | |
| 7,728,098 B2 | 6/2010 | Dams et al. | |
| 7,745,653 B2 | 6/2010 | Iyer et al. | |
| 7,825,272 B2 | 11/2010 | Iyer | |
| 7,897,678 B2 | 3/2011 | Qiu | |
| 8,002,886 B2 | 8/2011 | Clark | |
| 8,015,970 B2 | 9/2011 | Klun | |
| 8,420,281 B2 * | 4/2013 | Qiu et al. | 430/5 |
| 2003/0180440 A1 * | 9/2003 | Elfersy et al. | 427/2.1 |
| 2003/0207963 A1 | 11/2003 | Zang | |
| 2004/0014718 A1 | 1/2004 | Pai et al. | |
| 2004/0077775 A1 | 4/2004 | Audenaert | |
| 2004/0092675 A1 | 5/2004 | Moore | |
| 2004/0147188 A1 | 7/2004 | Johnson | |
| 2005/0037932 A1 | 2/2005 | Liu et al. | |
| 2005/0042553 A1 | 2/2005 | Lu | |
| 2005/0054804 A1 | 3/2005 | Dams et al. | |
| 2005/0121644 A1 | 6/2005 | Dams et al. | |
| 2005/0164010 A1 | 7/2005 | Trombetta | |
| 2005/0196626 A1 | 9/2005 | Knox | |
| 2005/0196696 A1 | 9/2005 | King | |
| 2005/0233103 A1 | 10/2005 | Enomoto | |
| 2006/0008742 A1 * | 1/2006 | Itoh et al. | 430/320 |
| 2006/0147177 A1 | 7/2006 | Jing | |
| 2006/0148350 A1 | 7/2006 | Chang | |
| 2006/0153993 A1 | 7/2006 | Schmidt et al. | |
| 2006/0154091 A1 | 7/2006 | Schmidt et al. | |
| 2006/0165919 A1 | 7/2006 | Suzuki | |
| 2006/0216524 A1 | 9/2006 | Klun | |
| 2006/0228560 A1 | 10/2006 | Stewart | |
| 2007/0014927 A1 | 1/2007 | Buckanin et al. | |
| 2007/0128557 A1 | 6/2007 | Lu | |
| 2007/0275171 A1 | 11/2007 | Dang | |
| 2007/0287093 A1 | 12/2007 | Jing | |
| 2008/0041272 A1 | 2/2008 | Tomasino | |
| 2008/0075947 A1 | 3/2008 | Padiyath | |
| 2008/0096129 A1 * | 4/2008 | Itoh et al. | 430/270.1 |
| 2008/0124555 A1 | 5/2008 | Klun | |
| 2009/0025608 A1 | 1/2009 | Qiu | |
| 2009/0025727 A1 | 1/2009 | Klun et al. | |
| 2009/0148711 A1 | 6/2009 | LeBlanc | |
| 2010/0092686 A1 | 4/2010 | Laryea | |
| 2010/0160595 A1 | 6/2010 | Klun | |
| 2011/0008733 A1 | 1/2011 | Qiu et al. | |
| 2011/0020657 A1 | 1/2011 | Chang et al. | |
| 2011/0027702 A1 | 2/2011 | Qiu et al. | |
| 2011/0065045 A1 | 3/2011 | Qiu et al. | |

FOREIGN PATENT DOCUMENTS

| | | |
|---|---|---|
| EP | 0 271 872 | 6/1988 |
| EP | 0 572 179 | 12/1993 |
| EP | 1083205 | 3/2001 |
| EP | 1 225 187 | 7/2002 |
| EP | 1 225 188 | 7/2002 |
| EP | 1411073 | 4/2004 |
| FR | 2886309 | 12/2006 |
| GB | 2 218 097 | 11/1989 |
| JP | 2232251 | 9/1990 |
| JP | 10176139 | 6/1998 |
| JP | 2001089625 A * | 4/2001 |
| JP | 2002-053805 A | 2/2002 |
| JP | 2002-105205 A | 4/2002 |
| JP | 2004250517 | 9/2004 |
| JP | 2005046767 | 2/2005 |
| JP | 2005292228 A * | 10/2005 |
| JP | 2006169328 | 6/2006 |
| KR | 10-2006-0080182 | 7/2006 |
| WO | WO 03/055954 | 7/2003 |
| WO | WO 03/072625 | 9/2003 |
| WO | WO 2004/024790 | 3/2004 |
| WO | WO 2004/056495 | 7/2004 |
| WO | WO 2005/014742 | 2/2005 |
| WO | WO 2005/023822 | 3/2005 |
| WO | WO 2006/030721 | 3/2006 |
| WO | WO 2006/074033 | 7/2006 |
| WO | WO 2008/131715 | 11/2008 |
| WO | WO 2009/035874 | 3/2009 |
| WO | WO 2009/069974 | 6/2009 |
| WO | WO 2009/083564 | 7/2009 |
| WO | WO 2009/086515 | 7/2009 |
| WO | WO 2009/114572 | 9/2009 |
| WO | WO 2009/114580 | 9/2009 |
| WO | WO 2011/034845 | 3/2011 |
| WO | WO 2011/034847 | 3/2011 |
| WO | WO 2011/034885 | 3/2011 |

OTHER PUBLICATIONS

Coggio, "New Durable, Soil Resistant Optical Film for Front Surface Protection of Flat-Panel Displays", Digest of Technical Papers, Society for Information Display International Symposium, 2005, vol. 36, pp. 175-177.

"Epoxide", source unknown, date unknown but believed to be >1 year prior to the date of the filing of the present application, 4 pages.

"Epoxy Resins", source unknown, date unknown but believed to be >1 year prior to the date of the filing of the present application, 4 pages.

"Mask Process", PKL, 1997, Choognam, Korea, [online], [retrieved from the internet on Feb. 25, 2008], URL <www.pkl.co.kr/english/product/product05.html>, 3 pages.

Physical Review E, Statistical Physics, Plasmas, Fluids, and Related Interdisciplinary Topics, Feb. 1999, Part A, Third Series, vol. 59, No. 2, 5 pages.

Sangermano, "Fluorinated Alcohols as Surface-Active Agents in Cationic Photopolymerization of Epoxy Monomers", Journal of Polymer Science: Part A: Polymer Chemistry, Feb. 2006, vol. 43, pp. 4144-4150.

(56) References Cited

OTHER PUBLICATIONS

Sangermano, "Fluorinated Hyperbranched Polymers as Additives in Cationic Photopolymerization", Macromolecular Materials and Engineering, 2004, vol. 289, No. 8, pp. 722-727.

Sangermano, "Synthesis and Cationic Photopolymerization of a New Fluorinated Oxetane Monomer", Polymer, 2004, vol. 45, No. 7, pp. 2133-2139.

Sangermano, "Synthesis and Cationic Photopolymerization of New Fluorinated Polyfunctional Propenyl Ether Oligomers", Journal of Polymer Science, Part A: Polymer Chemistry, 2006, vol. 44, pp. 6943-6951.

Yarbrough, "Contact Angle Analysis, Surface Dynamics, and Biofouling Characteristics of Cross-Linkable, Random Perfluoropolyether-Based Graft Terpolymers", Macromolecules, 2006, vol. 39, No. 7, pp. 2521-2528.

International Search Report, PCT/US2010/040349, mailed Feb. 18, 2011, 3 pages.

Yarbrough et al., "Contact Angle Analysis, Surface Dynamics, and Biofouling Characteristics of Cross-Linkable, Random Perfluoropolyether-Based Graft Terpolymers", Macromolecules, 2006, 2521-2528, vol. 39.

Co-pending U.S. Appl. No. 13/389,041, filed Sep. 14, 2010.
Co-pending U.S. Appl. No. 13/389,043, filed Sep. 14, 2010.

\* cited by examiner

CURABLE COMPOSITIONS, METHOD OF COATING A PHOTOTOOL, AND COATED PHOTOTOOL

CROSS-REFERENCE TO RELATED APPLICATIONS

This application is a national stage filing under 35 U.S.C. 371 of PCT/US2010/040349, filed Jun. 29, 2010, which claims priority to U.S. Provisional Application No. 61/227228, filed Jul. 21, 2009, the disclosure of which is incorporated by reference in its entirety herein.

TECHNICAL FIELD

The present disclosure broadly relates to protective coatings for phototools.

BACKGROUND

In the printed circuit industry, photographic masks bearing an image corresponding to an electrical circuit, typically represented by a series of lines of dots at a high resolution, are known as phototools. Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared by forming a film surface of a photosensitive emulsion layer on an optically clear substrate (e.g., a glass substrate, fused silica or polyethylene terephthalate (PET), polycarbonate, or poly(methyl)methacrylate substrate). The image often consists of many fine lines and junctions spaced closely together, and is typically present as an image layer disposed on a transparent substrate, although it may be disposed within the substrate in some cases. During its use to make printed circuit boards, the phototool is placed face down on a photoresist layer used to manufacture the printed circuit board, and a contact print is made by exposing the photoresist to high intensity light through the phototool. In this way, a single phototool can be used to make multiple contact prints.

Photoresists on which the phototool is placed are usually laminated on sheet copper and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected by microscopy to ensure line continuity. Depending upon the size and the intricacy of the phototool, such microscopic inspections can take 2 to 3 hours.

Since typical phototools are vulnerable to scratching, and since abrasion is a serious problem during normal use of a phototool, protective films and overcoats are often employed to protect the phototool. For example, polyester films coated with various kinds of pressure-sensitive adhesives have been laminated to image layers of phototools to protect the image. Because of their thickness, however, laminating films can cause optical distortion and hence loss of resolution. Thinner protective coatings can be obtained by coating the surfaces of phototools with liquid compositions. After application, the thin liquid coating is hardened to yield the desired protective coat. Epoxy silanes and acrylate esters (for example, polyurethane acrylates) are useful in such coatings because of their resistance to abrasion. Many protective overcoats have limited release properties, however, and may tend to stick to the surface of the photoresist, particularly when relatively sticky materials such as high viscosity solder mask inks are present. As a result they can be damaged during removal from the photoresist.

SUMMARY

In one aspect, the present disclosure provides a curable composition comprising:
an epoxy silane represented by formula

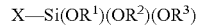

wherein $R^1$, $R^2$ and $R^3$ independently represent alkyl groups having from 1 to 4 carbon atoms, and X represents an organic group having at least one oxirane ring;
a fluorinated silane represented by formula

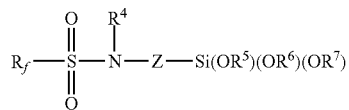

wherein:
$R_f$ represents a perfluoroalkyl group having from 3 to 5 carbon atoms;
$R^4$ represents H or an alkyl group having from 1 to 4 carbon atoms;
$R^5$, $R^6$ and $R^7$ independently represent alkyl groups having from 1 to 4 carbon atoms; and
Z represents a divalent organic linking group; and
a photoacid.

In another aspect, the present disclosure provides a method of coating a phototool, the method comprising coating a curable composition onto at least a portion of the phototool and curing the curable composition, wherein the curable composition comprises:
an epoxy silane represented by formula

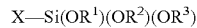

wherein $R^1$, $R^2$ and $R^3$ independently represent alkyl groups having from 1 to 4 carbon atoms, and X represents an organic group having at least one oxirane ring;
a fluorinated silane represented by formula

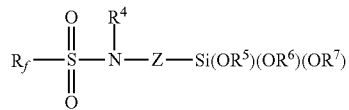

wherein:
$R_f$ represents a perfluoroalkyl group having from 3 to 5 carbon atoms;
$R^4$ represents H or an alkyl group having from 1 to 4 carbon atoms;
$R^5$, $R^6$ and $R^7$ independently represent alkyl groups having from 1 to 4 carbon atoms; and
Z represents a divalent organic linking group; and
a photoacid.

In yet another aspect, the present disclosure provides a coated phototool comprising a phototool having a protective coating disposed on at least a portion of a major surface thereof; wherein the protective coating comprises a reaction product of a curable composition comprising:
an epoxy silane represented by formula $$X—Si(OR^1)(OR^2)(OR^3)$$

wherein $R^1$, $R^2$ and $R^3$ independently represent alkyl groups having from 1 to 4 carbon atoms, and X represents an organic group having at least one oxirane ring;

a fluorinated silane represented by formula $$R_f—\overset{\overset{O}{\|}}{\underset{\underset{O}{\|}}{S}}—\overset{R^4}{\underset{}{N}}—Z—Si(OR^5)(OR^6)(OR^7)$$

wherein:
$R_f$ represents a perfluoroalkyl group having from 3 to 5 carbon atoms;
$R^4$ represents H or an alkyl group having from 1 to 4 carbon atoms;
$R^5$, $R^6$ and $R^7$ independently represent alkyl groups having from 1 to 4 carbon atoms; and
Z represents a divalent organic linking group; and
a photoacid.

In some embodiments, the epoxy silane is represented by a formula selected from the group consisting of $$H_2C\overset{O}{\overset{/\backslash}{—}}CH—Q—Si(OR^1)(OR^2)(OR^3) \quad \text{and}$$

[cyclohexene oxide structure]—Q—Si(OR^1)(OR^2)(OR^3)

wherein $R^1$, $R^2$ and $R^3$ independently represent alkyl groups having from 1 to 4 carbon atoms, and Q represents a divalent organic linking group that is free of interfering groups. In some embodiments, the epoxy silane is selected from the group consisting of beta-(3,4-epoxycyclohexyl)ethyltrimethoxysilane and gamma-glycidoxypropyltrimethoxysilane.

In some embodiments, $R_f$ is perfluorobutyl. In some embodiments, $R^4$ is methyl.

In some embodiments, the photoacid is selected from the group consisting of triarylsulfonium salts and diaryliodonium salts.

In some embodiments, the curable composition contains less than five percent by weight of volatile organic solvent based on a total weight of the curable composition.

Advantageously, curable compositions according to the present disclosure can be used to provide protective coatings on phototool surfaces (especially on image layers) that provide abrasion and soil resistance and are resistant to removal by adhesion to sticky materials such as some photoresists.

As used herein:
the term "photoacid" refers to a compound that generates a strong Lewis acid (e.g., strong enough to cure an epoxy resin) if exposed to light (typically ultraviolet and/or visible light); and
the term "oxirane ring" is conventional and refers to a three-member ring having two tetracoordinate carbon atoms and one oxygen atom.

DETAILED DESCRIPTION

Curable compositions according to the present disclosure generally comprise one or more epoxy silane compounds, one or more fluorinated silanes, and one or more photoacids. The compositions may also comprise solvent; however, the present disclosure is generally practiced most advantageously in the substantial absence of solvent Useful epoxy silanes are represented by the formula $$X—Si(OR^1)(OR^2)(OR^3)$$

$R^1$, $R^2$ and $R^3$ independently represent alkyl groups having from 1 to 4 carbon atoms. For example, $R^1$, $R^2$ and $R^3$ may independently represent methyl, ethyl, propyl, or butyl groups.

X represents an organic group, which is monovalent and has at least one oxirane ring.

In some embodiments, the epoxy silane is represented by a formula selected from the group consisting of $$H_2C\overset{O}{\overset{/\backslash}{—}}CH—Q—Si(OR^1)(OR^2)(OR^3) \quad \text{and}$$

[cyclohexene oxide structure]—Q—Si(OR^1)(OR^2)(OR^3)

wherein $R^1$, $R^2$ and $R^3$ are as previously defined and Q represents a divalent organic linking group that is free of interfering groups. Examples of Q include linear, cyclic, and/or branched alkylene, arylene, and combinations thereof, with or without substitution of at least one carbon atom by an N, S, or O atom, sulfonyl group, nitro group, halogen, carbonyl group, or a combination thereof. The epoxy silane compounds may be monomeric, oligomeric, or in some cases even polymeric, provided that they have a polymerizable epoxy group and a polymerizable trialkoxysilyl group.

Typically, the curable epoxy silane compounds are epoxy-terminated silane compounds having terminal polymerizable epoxy groups and terminal polymerizable silane groups, the bridging of these groups being as described above.

Examples of useful epoxy silanes include glycidoxymethyltrimethoxysilane, glycidoxymethyltriethoxysilane, glycidoxymethyltripropoxysilane, glycidoxymethyltributoxysilane, beta-glycidoxyethyltrimethoxysilane, beta-glycidoxyethyltriethoxysilane, beta-glycidoxyethyltripropoxysilane, beta-glycidoxyethyltributoxysilane, beta-glycidoxyethyltrimethoxysilane, alpha-glycidoxyethyltriethoxysilane, alpha-glycidoxyethyltripropoxysilane, alpha-glycidoxyethyltributoxysilane, gamma-glycidoxypropyltrimethoxysilane, gamma-glycidoxypropyltriethoxysilane, gamma-glycidoxypropyltripropoxysilane, gamma-glycidoxypropyltributoxysilane, beta-glycidoxypropyltrimethoxysilane, beta-glycidoxypropyltriethoxysilane, beta-glycidoxypropyltripropoxysilane, beta-glycidoxypropyltributoxysilane, alpha-glycidoxypropyltrimethoxysilane, alpha-glycidoxypropyltriethoxysilane, alpha-glycidoxypropyltripropoxysilane, alpha-glycidoxypropyltributoxysilane, gamma-glycidoxybutyltrimethoxysilane, delta-glycidoxybutyltriethoxysilane, delta-glycidoxybutyltripropoxysilane, delta-glycidoxybutyltributoxysilane, delta-glycidoxybutyltrimethoxysilane, gamma-glycidoxybutyltriethoxysilane, gamma-glycidoxybutyltripropoxysilane, gamma-propoxybutyltributoxysilane, delta-glycidoxybutyltrimethoxysilane, delta-glycidoxybutyltriethoxysilane, delta-glycidoxybutyltripropoxysilane, alpha-glycidoxybutyltrimethoxysilane, alpha-glycidoxybutyltriethoxysilane, alpha-glycidoxybutyltripropoxysilane, alpha-glycidoxybutyltributoxysilane, (3,4-epoxycyclohexyl)methyltrimethoxysilane, (3,4-epoxycyclohexyl)methyltriethoxysilane, (3,4-epoxycyclohexyl)methyltripropoxysilane, (3,4-epoxycyclohexyl)methyltributoxysilane, (3,4-epoxycyclohexyl)ethyltrimethoxysilane, (3,4-epoxycyclohexyl)ethyltriethoxysilane, (3,4-epoxycyclohexyl)ethyltripropoxysilane, (3,4-epoxycyclohexyl)ethyltributoxysilane, (3,4-epoxycyclohexyl)propyltrimethoxysilane, (3,4-epoxycyclohexyl)propyltriethoxysilane, (3,4-epoxycyclohexyl)propyltripropoxysilane, (3,4-epoxycyclohexyl)propyltributoxysilane, (3,4-epoxycyclohexyl)butyltrimethoxysilane, (3,4-epoxycyclohexyl)butyltriethoxysilane, (3,4-epoxycyclohexyl)butyltripropoxysilane, and (3,4-epoxycyclohexyl)butyltributoxysilane.

Examples of additional epoxy silanes useful in practice of the present disclosure are described, for example, in U.S. Pat. No. 4,049,861 (Nozari); U.S. Pat. No. 4,100,134 (Robins et al.); and U.S. Pat. No. 4,293,606 (Zollinger et al.).

Epoxy silanes typically comprise at least 50, 60, 70, 80, or 90 percent by weight of the curable composition, based on the total weight of the curable composition, although other amounts may also be used. More typically, they comprise from about 80 percent by weight to about 98 percent by weight of the curable composition, based on the total weight of the curable composition.

Typically, the epoxy silane is substantially free of groups that interfere with cationic epoxy polymerization (i.e., interfering groups), although this is not a requirement. Example of interfering groups may include basic groups such as groups containing 1°, 2°, and/or 3° amines and/or phosphines, and hydroxyl groups (other than as bound to Si) as will be understood by those of ordinary skill in the art;

Useful fluorinated silanes are represented by the formula

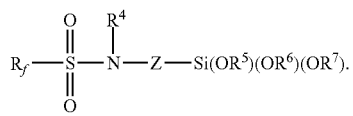

$R_f$ represents a perfluoroalkyl group having from 3 to 5 carbon atoms. Examples include perfluoropropyl, perfluorobutyl, and perfluoropentyl.

$R^4$ represents H or an alkyl group having from 1 to 4 carbon atoms. Examples include H, methyl, ethyl, propyl, and butyl.

$R^5$, $R^6$ and $R^7$ independently represent alkyl groups having from 1 to 4 carbon atoms. Examples include methyl, ethyl, propyl, and butyl.

Z represents a divalent organic linking group. Examples of Z include linear, cyclic, and/or branched alkylene, arylene, and combinations thereof, with or without substitution of at least one carbon atom by an N, S, or O atom, sulfonyl group, nitro group, halogen, carbonyl group, or a combination thereof.

Fluorinated silanes may comprise less than 50, 40, 30, 20, 10, 5, 2, or even one percent by weight of the curable composition, based on the total weight of the curable composition, although other amounts may also be used. Typically, they comprise less than 15 percent by weight of the curable composition, based on the total weight of the curable composition.

Photoacids form cationic initiators when exposed to actinic radiation (e.g., UV or visible light). The curable compositions used in the present disclosure comprise a photoacid to cationically polymerize the curable composition. Examples of useful photoacids include diaryliodonium salts, triarylsulfonium salts, benzylsulfonium salts, phenacylsulfonium salts, N-benzylpyridinium salts, N-benzylpyrazinium salts, N-benzylammonium salts, phosphonium salts, hydrazinium salts, and ammonium borate salts. Triarylsulfonium and diaryliodonium salts are particularly useful. Of course the selection of the negative counterion (i.e., anion) of the salt will affect its performance. In general, the anion should be one that does not interfere substantially with cationic polymerization of epoxides or alkoxysilanes. Examples include tetrafluoroborate, hexafluorophosphate, tris(fluorinated arylsulfonyl)methide, and hexafluoroantimonate.

Accordingly, exemplary useful photoacids include: onium salts of Group Va elements such as, for example, triphenylphenacylphosphonium hexafluorophosphate; onium salts of Group VIa elements such as, for example, triphenylsulfonium tetrafluoroborate, triphenylsulfonium hexafluorophosphate and triphenylsulfonium hexafluoroantimonate; and onium salts of Group VIIa elements, such as iodonium salts such as diphenyliodonium chloride and diaryliodonium hexafluoroantimonate. The aromatic onium salts and their use as photoacids in the polymerization of epoxy compounds are described in detail in U.S. Pat. No. 4,058,401 (Crivello); U.S. Pat. No. 4,069,055 (Crivello); U.S. Pat. No. 4,101,513 (Fox et al.), and U.S. Pat. No. 4,161,478 (Crivello).

Commercially available photoacids include, for example, those available as CYRACURE UVI-6976 (a mixture of triarylsulfonium hexafluoroantimonate salts in propylene carbonate) and UVI-6992 from Dow Chemical Co of Midland, Mich.

Photoacid is typically present in the compositions of the present disclosure in an effective amount (i.e., and amount that when exposed to actinic radiation is effective to cure the curable composition. The amount of photoacid typically is in a range of from 1 percent to 5 by weight, based on the total weight of the curable composition, although other amounts may also be used.

The curable compositions may further comprise one or more polyepoxide compounds. Polyepoxide compounds can, for example, accelerate polymerization of the composition. They can also be used to adjust the softness or to reduce brittleness of the cured composition. Examples of useful polyepoxides include diepoxides such as those disclosed in U.S. Pat. No. 4,293,606 (Zollinger et al.). If present, the polyepoxide is typically a cycloaliphatic diepoxide compound such as, for example, 3,4-epoxycyclohexylmethyl-3,4-epoxycyclohexanecarboxylate.

Curable compositions according to the present disclosure may also comprise other optional components such as, for example, one or more: curable mono- and/or di-silanes (for example, to adjust hardness), titanates, and/or zirconates; surfactants; matting agents; and inorganic particles. Examples include tetramethoxysilane, tetraethoxysilane, methyltriethoxysilane, dimethyldiethoxysilane, octadecyltriethoxysilane, methyltrichlorosilane, tetramethyl orthotitanate, tetraethyl orthotitanate, tetraisopropyl orthotitanate, tetraethyl zirconate, tetraisopropyl zirconate, and tetrapropyl zirconate.

In some embodiments, however, the curable compositions may comprise one or more solvents such as, for example, ketones (e.g., acetone or methyl isobutyl ketone), esters ((e.g., ethyl acetate), or ethers ((e.g., methyl tert-butyl ether or tetrahydrofuran). Typically, curable compositions of the present disclosure contain less than ten percent of solvent based on the total weight of the composition, and more typically less than five percent. Desirably, curable compositions of the present disclosure contain less than one percent of solvent based on the total weight of the composition, or are solvent-free.

Curable compositions according to the present disclosure may be readily applied to the phototool using coating techniques known in the art such as, for example, spraying, dip coating, gravure coating, roll coating, knife coating, and curtain coating. Typically, the curable composition is applied at a thickness that will result in a cured thickness between about 0.5 microns and about 40 microns thick, more typically between 2 and 10 microns, but other thicknesses may also be used.

Curable compositions according to the present disclosure may cured by exposure to actinic radiation such as, for example, visible and/or ultraviolet light, optionally in combination with heating. The choice of exposure conditions is well within the capability of one of ordinary skill in the art.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight.

Materials

All solvents were standard reagent grade obtained from commercial sources and were used without further purification unless specified otherwise.

A-186 is beta-(3,4-epoxycyclohexyl)ethyltrimethoxysilane), obtained from Momentive Advanced Materials of Albany, N.Y.

A-187 is gamma-glycidoxypropyltrimethoxysilane, obtained from Momentive Advanced Materials.

PAG-1 is a photoacid, a 50 percent triarylsulfonium hexafluoroantimonate solution in propylene carbonate available as CYRACURE UVI-6974 from Dow Chemical Company of Midland, Mich.

PAG-2 is a photoacid, $(C_{12}H_{25}Ph)_2I^{(+)}SbF_6^{(-)}$, prepared essentially using the process described in Example 4 of U.S. Pat. No. 4,279,717 (Eckberg et al.).

TEOS is tetraethyl orthosilicate, available from Sigma-Aldrich Corporation of St. Louis, Mo.

EP-1 is bis-(3,4-epoxycyclohexylmethyl)adipate, obtained as ERL-4299 from Dow Chemical Company.

EP-2 is 3,4-epoxycyclohexylmethyl-3,4-epoxycyclohexylcarboxylate, obtained as ERL-4221 from Dow Chemical Company.

ES-1, is a blend of A-187 and PAG-1 at a ratio of 92:8 by weight.

ES-2, is a blend of A-186 and PAG-1 at a ratio of 92:8 by weight.

ES-3, is a blend of A-187 and PAG-2 at a ratio of 97:3 by weight.

FA-1 is $CF_3CF_2CF_2CF_2S(=O)_2N(CH_3)CH_2CH_2CH_2Si(OCH_3)_3$. It was essentially prepared by the procedure of example 6 of U.S. Pat. No. 5,274,159 (Pellerite et al.), except that $CF_3CF_2CF_2CF_2S(=O)_2N(CH_3)CH_2CH=CH_2$ was used instead of $C_8F_{17}S(=O)_2N(CH_3)CH_2CH=CH_2$).

Test Methods

Contact Angle Test

Cured coatings to be evaluated were rinsed for 1 minute by hand agitation in isopropyl alcohol (IPA), which was allowed to evaporate before measuring the water (H2O) and hexadecane (HD) contact angles. Measurements were made using as-received reagent-grade hexadecane from Aldrich Chemical Co., and deionized water filtered through a filtration system from Millipore Corp. of Billerica, Mass. on a video contact angle system analyzer (VCA-2500XE) from AST Products of Billerica, Mass. Reported values are the averages of measurements on at least three drops measured on the right and the left sides of the drops. Drop volumes were 5 microliters for static contact angle measurements and 1-3 microliters for advancing and receding contact angle measurements.

Marker Repellency Test

A line was drawn across the surface of cured coatings to be evaluated using a black Sharpie marker from Sanford of Bellwood, Ill. The samples were rated for their appearance and for the ability to repel black ink from the Sharpie marker. A "Yes" rating means that there is at least some repellency to marker as determined by beading of the marker ink, and a "No" rating means no observed repellency.

Solvent Resistance Test

One drop (~25 cm diameter) of selected organic solvents was placed on cured coatings to be evaluated. The solvent was allowed to evaporate at room temperature and the changes in appearance of the sample was visually rated and recorded. A rating of "C" means clear surface (i.e., no change of the coating).

Steel Wool Durability Test

Steel wool abrasion resistance of cured coatings to be evaluated was tested cross-web to the coating direction by use of a mechanical device capable of oscillating steel wool fastened to a stylus by means of a rubber gasket across the film's surface. The stylus oscillated over a 10 cm wide sweep width at a rate of 3.5 wipes/second wherein a "wipe" is defined as a single travel of 10 cm. The stylus had a flat, cylindrical geometry with a diameter of 3.8 mm having a 200 g load. The device was equipped with a platform on which weights were placed to increase the force exerted by the stylus normal to the film's surface. The steel wool was obtained from Rhodes-American, a division of Homax Products of Bellingham, Wash. under the trade designation "#0000-SUPER-FINE" and was used as received. A single sample was tested for each example, with the weight in grams applied to the stylus and the number of 50 wipes employed during testing reported in the tables. After the test, the samples were checked for the presence of scratches and water and hexadecane contact angles were measured as described above to determine the durability of the coatings.

Cleaning Tissue Durability Test

Durability of cured coatings to be evaluated was measured in a similar manner to the steel wool durability test except that a pre-moistened Sight Savers lens cleaning tissue from Bausch & Lomb Inc. of Rochester, N.Y. was used for durability testing, and the coatings were wiped by hand instead of using a stylus. After wiping the surface of cured film for 20 times by hand applying moderate pressure, the appearance of surface was visually checked. A rating of "C" means the coating remained clear and no damage was observed.

Hardness Test

Hardness of cured coatings to be evaluated was measured using a Gardo/Wilff Wilborn Pencil Scratch Hardness Tester from Paul N. Gardner Co., Inc, of Pompano Beach, Fla. For the test, the coatings were scratched using pencils of varying hardness (e.g., 4H, 5H, 6H etc). The highest hardness that the coating can survive without suffering damage was assigned as the hardness of the coating.

Examples 1-9 and Comparative Examples A-C

Examples 1-9 were prepared by blending desired epoxy-silane and short fluorochemical tailed additives at predetermined amounts (in weight as indicated in parentheses next to the component) as reported in Table 1. Comparative Examples A-C were prepared from various epoxy-silanes as indicated in Table 1 without any fluorochemical additives. All samples for Examples 1-9 and Comparative Examples A-C were homogeneous and clear solutions indicating that the epoxy-silane and fluorochemical additives were compatible. The resulting solutions were then coated on primed PET substrates with a No. 6 wire wound rod from RD Specialties of Webster, N.Y., and then cured under two Sylvania Germicidal G15T8 (15W) bulbs obtained from Atlanta Light Bulbs, Inc. of Tucker, Ga. in air for 2 minutes. The coatings of Examples 1-9 and Comparative Examples A-C were tested for their marker repellency, water and hexadecane contact angles. The results are reported in Table 1 below.

TABLE 1

| EXAMPLE | FORMULATION (parts) | MARKER REPELLENCY | $H_2O$ CONTACT ANGLE, degrees | | | HD CONTACT ANGLE, degrees | | |
|---|---|---|---|---|---|---|---|---|
| | | | Advancing | Receding | Static | Advancing | Receding | Static |
| Comparative Example A | ES-1(100) | No | 52.9 | 38.3 | 52.5 | 8.8 | 4.3 | 11.3 |
| 1 | ES-1(98)/FA-1(2) | Yes | 114.9 | 75.8 | 103.8 | 76.4 | 55.3 | 64.8 |
| 2 | ES-1(95)/FA-1(5) | Yes | 114.6 | 95.1 | 110.1 | 77.1 | 64.0 | 69.5 |
| 3 | ES-1(92.5)/FA-1(7.5) | Yes | 117.3 | 84.2 | 109.3 | 73.0 | 63.9 | 74.0 |
| 4 | ES-1(90)/FA-1(10) | Yes | 119.5 | 85.6 | 107.9 | 79.4 | 60.3 | 67.8 |
| 5 | ES-1(85)/FA-1(15) | Yes | 116.6 | 90.6 | 107.1 | 75.0 | 61.2 | 65.8 |
| Comparative Example B | ES-2(100) | No | 58.8 | 42.5 | 56.8 | 12.1 | 5.8 | 7.9 |
| 6 | ES-2(98)/FA-1(2) | Yes | 107.6 | 75.2 | 96.3 | 55.6 | 34.8 | 49.8 |
| 7 | ES-2(95)/FA-1(5) | Yes | 114.1 | 84.1 | 102.0 | 71.4 | 50.7 | 55.6 |
| Comparative Example C | ES-3(100) | No | 54.3 | 40.1 | 51.5 | 11.6 | 5.3 | 9.3 |
| 8 | ES-3(95)/FA-1(5) | Yes | 116.1 | 86.3 | 102.7 | 75.3 | 56.3 | 66.4 |
| 9 | ES-3(90)/FA-1(10) | Yes | 121.5 | 93.2 | 109.8 | 72.0 | 65.9 | 67.8 |

Examples 10-13

Examples 10-13 were prepared in the same manner as examples 1-9, except that the coatings were prepared on either glass or polycarbonate (PC) substrates as indicated on Table 2. The coatings were tested for their water and hexadecane contact angles. The results are reported in Table 2 below.

TABLE 2

| EXAMPLE | FORMULATION | SUBSTRATE | $H_2O$ CONTACT ANGLE, degrees | | | HD CONTACT ANGLE, degrees | | |
|---|---|---|---|---|---|---|---|---|
| | | | Advancing | Receding | Static | Advancing | Receding | Static |
| 10 | ES-1(95)/FA-1(5) | Glass | 110.0 | 84.0 | 104.7 | 72.5 | 61.1 | 64.7 |
| 11 | ES-1(90)/FA-1(10) | Glass | 117.8 | 80.7 | 109.3 | 75.9 | 62.9 | 66.5 |
| 12 | ES-1(85)/FA-1(15) | Glass | 117.3 | 89.0 | 108.6 | 75.7 | 64.1 | 65.7 |
| 13 | ES-1(90)/FA-1(10) | PC | 115.7 | 83.6 | 103.7 | 75.9 | 60.6 | 64.9 |

Examples 14-16

Examples 14-16 were run to evaluate the hardness properties of coatings prepared from a composition containing 95 parts ES-1 and 5 parts FA-1 according to the present disclosure with varying curing conditions and subsequent aging times on glass or PET substrates. Example 14 and 16 were cured by exposing samples to Sylvania Germicidal G15T8 (15W) bulbs obtained from Atlanta Light Bulbs, Inc. of Tucker, Ga., for 2 minutes. Example 15 was cured by exposing coatings to a Light-Hammer 6 UV Processor equipped with an H-bulb from Gaithersburg, Md., operating under nitrogen atmosphere at 100 percent lamp power on a conveyor belt line moving at a speed of 3 meters per minute. The cured samples were aged for desired period of time and the hardness of the resulting coatings was measured using the test method for measuring hardness described above. The substrates, the aging times as well as the hardness of the resulting coatings are reported in Table 3 below.

TABLE 3

| EXAMPLE | SUBSTRATE | AGING TIME | HARDNESS |
|---|---|---|---|
| 14 | Glass | 2 minutes | 1H |
|  |  | 1 hour | 3H |
|  |  | 4 hours | 4H |
|  |  | 24 hours | 5H |
|  |  | 48 hours | 6H |
| 15 | Glass | 2 minutes | 4H |
|  |  | 24 hours | 6H |

TABLE 3-continued

| EXAMPLE | SUBSTRATE | AGING TIME | HARDNESS |
|---|---|---|---|
| 16 | PET | 2 minutes | HB |
|  |  | 24 hours | 4H |
|  |  | 48 hours | 4H |

Examples 17-22

Examples 17-22 were run to demonstrate the effects of adding cross-linkers on hardness of coatings prepared from compositions according to the disclosure on glass substrates. Several compositions were prepared by mixing the desired epoxy-silane, fluorochemical additive and cross-linkers at predetermined amounts (in weight as indicated in parentheses next to the component). The solutions were then coated on glass substrates and cured by exposing them to Sylvania Germicidal G15T8 (15W) bulbs obtained from Atlanta Light Bulbs, Inc., Tucker, Ga., in air for 2 minutes. The cured samples were aged for desired period of time (either 24 hours at room temperature, RT, or minutes at 100° C.) and the hardness of the resulting coatings was measured using the test method for measuring hardness described above. Table 4 reports the compositions of the coatings including the cross-linkers used, qualitative assessment of the coating quality and hardness of coatings immediately after curing, hardness after 24 hours at RT and hardness after 10 minutes at 100° C.

TABLE 4

| EXAMPLE | FORMULATION | COATING QUALITY | INITIAL HARDNESS AFTER CURING | HARDNESS AFTER 24 HOURS AT RT | HARDNESS AFTER HEATING AT 100° C. FOR 10 MINUTES |
|---|---|---|---|---|---|
| 17 | ES-1(95)/FA-1(5) | Good | 1H | 5H | 8H |
| 18 | ES-1(90)/FA-1(5)/TEOS(5) | Good | 4H | 6H | 8H |
| 19 | ES-1(85)/FA-1(5)/TEOS(10) | OK | 4H | 6H | 8H |
| 20 | ES-1(90)/FA-1(5)/EP-1(5) | Good | 4H | 7H | 8H |
| 21 | ES-1(90)/FA-1(5)/EP-2(5) | Good | 4H | 7H | 8H |
| 22 | ES-1(85)/FA-1(5)/EP-2(10) | Good | 4H | 7H | 8H |

The cleaning tissue durability and the solvent resistance of several coatings prepared as described in examples above were determined using the respective methods described above. The solvent resistance of the coatings was determined for a variety of organic solvents including ethyl acetate (EtOAc, obtained from J. T. Baker of Philipsburg, N.J.), isopropyl alcohol (IPA, obtained from VWR International of West Chester, Pa.), N,N-dimethylformamide (DMF, Aldrich Chemical Company of Milwaukee, Wis.) acetone, toluene, methyl ethyl ketone (MEK), all obtained from EMD Chemicals, Inc. of Gibbstown, N.J. Table 5 (below) reports cleaning tissue durability and solvent resistance of several coatings made according to examples described above.

TABLE 5

| EXAMPLE | CLEANING TISSUE DURABILITY: | SOLVENT RESISTANCE: | | | | | |
|---|---|---|---|---|---|---|---|
|  |  | EtOAc | IPA | Acetone | Toluene | MEK | DMF |
| 1 | C | C | C | C | C | C | C |
| 2 | C | C | C | C | C | C | C |
| 7 | C | C | C | C | C | C | C |

TABLE 5-continued

| EXAMPLE | CLEANING TISSUE DURABILITY: | SOLVENT RESISTANCE: | | | | | |
|---|---|---|---|---|---|---|---|
| | | EtOAc | IPA | Acetone | Toluene | MEK | DMF |
| 8 | C | C | C | C | C | C | C |
| 9 | C | C | C | C | C | C | C |
| 11 | C | C | C | C | C | C | C |
| 13 | C | C | C | C | C | C | C |

The steel wool durability of several coatings prepared as described in examples above was determined using the method described above. Table 6 (below) reports the test results.

TABLE 6

| | AFTER STEEL WOOL TEST | | | | | | |
|---|---|---|---|---|---|---|---|
| | VISIBLE | H₂O CONTACT ANGLE | | | HD CONTACT ANGLE | | |
| EXAMPLE | SCRATCHES | Advancing | Receding | Static | Advancing | Receding | Static |
| 2 | No | 111 | 88 | 106 | 67 | 58 | 66 |
| 5 | No | 114 | 81 | 109 | 67 | 56 | 65 |
| 9 | No | 116 | 90 | 100 | 68 | 60 | 66 |
| 20 | No | 113 | 91 | 108 | 70 | 61 | 68 |

All patents and publications referred to herein are hereby incorporated by reference in their entirety. All examples given herein are to be considered non-limiting unless otherwise indicated. Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. A curable composition comprising:
an epoxy silane represented by formula

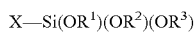

wherein $R^1$, $R^2$ and $R^3$ independently represent alkyl groups having from 1 to 4 carbon atoms, and X represents an organic group having at least one oxirane ring;

a fluorinated silane represented by formula

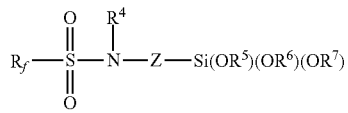

wherein:
$R_f$ represents a perfluoroalkyl group having from 3 to 5 carbon atoms;
$R^4$ represents H or an alkyl group having from 1 to 4 carbon atoms;
$R^5$, $R^6$ and $R^7$ independently represent alkyl groups having from 1 to 4 carbon atoms; and
Z represents a linear alkylene group; and
a photoacid.

2. The curable composition of claim 1, wherein the epoxy silane is represented by a formula selected from the group consisting of

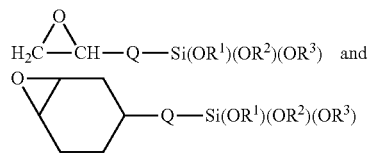

wherein $R^1$, $R^2$ and $R^3$ independently represent alkyl groups having from 1 to 4 carbon atoms, and Q represents a divalent organic linking group that is free of interfering groups.

3. The curable composition of claim 1, wherein the curable composition contains less than five percent by weight of volatile organic solvent based on a total weight of the curable composition.

4. The curable composition of claim 1, wherein the $R_f$ is perfluorobutyl.

5. The curable composition of claim 4, wherein the fluorinated silane has the formula $CF_3CF_2CF_2CF_2S(=O)_2N(CH_3)CH_2CH_2CH_2Si(OCH_3)_3$.

6. The curable composition of claim 1, wherein the epoxy silane is selected from the group consisting of beta-(3,4-epoxycyclohexyl)ethyltrimethoxysilane and gamma-glycidoxypropyltrimethoxysilane.

7. The curable composition of claim 1, wherein the photoacid is selected from the group consisting of triarylsulfonium salts and diaryliodonium salts.

8. A method of coating a phototool, the method comprising coating a curable composition onto at least a portion of the phototool and curing the curable composition, wherein the curable composition comprises:
an epoxy silane represented by formula

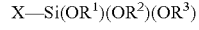

wherein $R^1$, $R^2$ and $R^3$ independently represent alkyl groups having from 1 to 4 carbon atoms, and X represents an organic group having at least one oxirane ring;

a fluorinated silane represented by formula

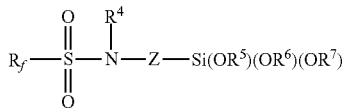

wherein:
- $R_f$ represents a perfluoroalkyl group having from 3 to 5 carbon atoms;
- $R^4$ represents H or an alkyl group having from 1 to 4 carbon atoms;
- $R^5$, $R^6$ and $R^7$ independently represent alkyl groups having from 1 to 4 carbon atoms; and
- Z represents a linear alkylene group; and a photoacid.

9. The method of claim 8, wherein the epoxy silane is represented by a formula selected from the group consisting of

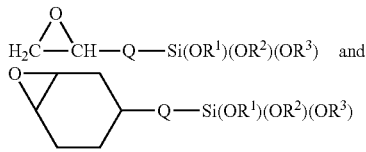

wherein $R^1$, $R^2$ and $R^3$ independently represent alkyl groups having from 1 to 4 carbon atoms, and Q represents a divalent organic linking group that is free of interfering groups.

10. The method of claim 8, wherein the curable composition contains less than five percent by weight of volatile organic solvent based on a total weight of the curable composition.

11. The method of claim 8, wherein the $R_f$ is perfluorobutyl.

12. The method of claim 11, wherein the $R^4$ is methyl.

13. The method of claim 8, wherein the epoxy silane is selected from the group consisting of beta-(3,4-epoxycyclohexyl)ethyltrimethoxysilane and gamma-glycidoxypropyltrimethoxysilane.

14. The method of claim 8, wherein the photoacid is selected from the group consisting of triarylsulfonium salts and diaryliodonium salts.

15. A coated phototool comprising a phototool having a protective coating disposed on at least a portion of a major surface thereof; wherein the protective coating comprises a reaction product of a curable composition comprising:

an epoxy silane represented by formula

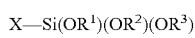

wherein $R^1$, $R^2$ and $R^3$ independently represent alkyl groups having from 1 to 4 carbon atoms, and X represents an organic group having at least one oxirane ring;

a fluorinated silane represented by formula

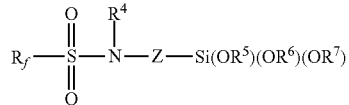

wherein:
- $R_f$ represents a perfluoroalkyl group having from 3 to 5 carbon atoms;
- $R^4$ represents H or an alkyl group having from 1 to 4 carbon atoms;
- $R^5$, $R^6$ and $R^7$ independently represent alkyl groups having from 1 to 4 carbon atoms; and
- Z represents a linear alkylene group; and a photoacid.

16. The coated phototool of claim 15, wherein the epoxy silane is represented by a formula selected from the group consisting of

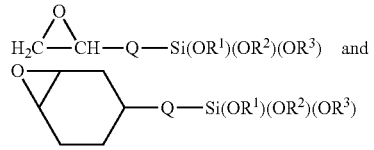

wherein $R^1$, $R^2$ and $R^3$ independently represent alkyl groups having from 1 to 4 carbon atoms, and Q represents a divalent organic linking group that is free of interfering groups.

17. The coated phototool of claim 16, wherein the curable composition contains less than five percent by weight of volatile organic solvent based on a total weight of the curable composition.

18. The coated phototool of claim 16, wherein the $R_f$ is perfluorobutyl.

19. The coated phototool of claim 18, wherein the $R^4$ is methyl.

20. The coated phototool of claim 15, wherein the epoxy silane is selected from the group consisting of beta-(3,4-epoxycyclohexyl)ethyltrimethoxysilane and gamma-glycidoxypropyltrimethoxysilane.

21. The coated phototool of claim 15, wherein the photoacid is selected from the group consisting of triarylsulfonium salts and diaryliodonium salts.

* * * * *